United States Patent
Dautartas et al.

(10) Patent No.: US 6,189,238 B1
(45) Date of Patent: Feb. 20, 2001

(54) PORTABLE PURGE SYSTEM FOR TRANSPORTING MATERIALS

(75) Inventors: Mindaugas F. Dautartas, Alburtis, PA (US); Ofer Sneh, Branchburg, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/201,526

(22) Filed: Nov. 30, 1998

(51) Int. Cl.[7] ........................................ F26B 3/00
(52) U.S. Cl. .................. 34/472; 34/480; 34/492; 34/202; 34/107; 34/72
(58) Field of Search ............................ 34/389, 443, 467, 34/472, 474, 480, 487, 492, 508, 509, 510, 516, 517, 576, 579, 591, 107, 89, 72, 201–202; 137/884; 29/722; 438/795; 96/117; 436/149; 414/277, 217.1; 134/1.2, 7, 113; 73/64.4

(56) References Cited

U.S. PATENT DOCUMENTS

| | | | | |
|---|---|---|---|---|
| 3,613,689 | * | 10/1971 | Crump ............................. | 128/303.1 |
| 4,527,421 | * | 7/1985 | Miller, Jr. ......................... | 73/64.4 |
| 4,722,333 | * | 2/1988 | Bartos ............................. | 128/202.27 |
| 5,069,235 | * | 12/1991 | Vetter et al. ..................... | 134/113 |
| 5,156,745 | * | 10/1992 | Cairo, Jr. et al. ................. | 210/703 |
| 5,342,580 | * | 8/1994 | Brenner ........................... | 422/92 |
| 5,351,415 | * | 10/1994 | Brooks et al. .................... | 34/389 |
| 5,382,127 | * | 1/1995 | Garric et al. .................... | 414/217 |
| 5,388,945 | * | 2/1995 | Garric et al. .................... | 414/217 |
| 5,390,785 | * | 2/1995 | Garric et al. .................... | 206/213.1 |
| 5,403,434 | * | 4/1995 | Moslehi ........................... | 156/643 |
| 5,411,358 | * | 5/1995 | Garric et al. .................... | 414/277 |
| 5,436,165 | * | 7/1995 | Brenner ........................... | 436/149 |
| 5,685,895 | * | 11/1997 | Hagiwara et al. ............... | 96/117 |
| 5,821,175 | * | 10/1998 | Engelsberg ..................... | 438/795 |
| 5,884,392 | * | 3/1999 | Lafond ............................. | 29/722 |
| 5,992,463 | * | 11/1999 | Redemann et al. .............. | 137/884 |

* cited by examiner

Primary Examiner—Stephen Gravini
Assistant Examiner—Andrea M. Joyce
(74) Attorney, Agent, or Firm—Gibbons, Del Deo, Dolan, Griffinger & Vecchione

(57) ABSTRACT

A portable purge system for transporting materials, such as semiconductor wafers used in the manufacture of ICs, comprises a carrier having compartments for releasably receiving and enclosing the materials therein. The carrier is flooded with an inert gas such as nitrogen so as to adsorb the nitrogen on the surface of the materials, dilute contaminants, and purge the contaminants from the carrier. The carrier and the flooding means are mounted in a transport case. A humidifier is connected to the flooding means so that the materials will adsorb water and thereby further resist adsorption of hydrocarbon contaminants.

24 Claims, 3 Drawing Sheets

PORTABLE PURGE SYSTEM FOR TRANSPORTING MATERIALS

FIELD OF THE INVENTION

This invention relates to the field of material transport, and more particularly to a portable system for continuously purging semiconductor wafers with an inert gas in order to transport the wafers from one clean environment to another clean environment without suffering contamination in transit.

BACKGROUND OF THE INVENTION

Materials used in the production of ICs (integrated circuits), such as silicon wafers and other semiconductor wafers, are handled and processed in an ultraclean environment, since the wafers are sensitive to both particulate and impurity contamination. Airborne particulates of only one micrometer in size can cause defects on the wafer surface. In a "clean room," filtered air is circulated in a vertical laminar flow pattern to eliminate particulates. Operators wear lint-free clothes, booties, gloves, and hoods to minimize particulates carried into the clean room. All chemicals, solvents, and metals used in the IC production process must be electronic grade, i.e., the highest purity grade, so as to minimize impurity contamination effects.

The impurity contamination occurs by way of the adsorption process, wherein atoms or molecules of the impurity in the solid, liquid or gaseous state are attracted by, and move onto, the surface of the substrate material. The extent of adsorption depends upon the temperature, pressure, concentration, and reactivity of the adsorbate. Substrates with high surface free energy will adsorb more readily. Adsorption saturates at about one layer of adsorbed molecules. The adsorbed monolayer exhibits lower free energy than a clean surface, and so the tendency to adsorb further is decreased as the monolayer is formed. Semiconductor wafers are hydrophilic, and adsorb polar molecules such as water very strongly. Thus, by allowing water to adsorb onto the substrate, further adsorption of impurities, especially highly reactive hydrocarbons, is greatly reduced.

During the manufacturing process, wafers are often transferred from one clean room to another clean room, and are inadvertently contaminated during the move. This necessitates recleaning upon arrival at the new station, a painstaking and time consuming process.

Current methods used to transport wafers without contamination have proven inadequate. One such method is to wrap the wafers in vacuum shrink plastic film while in the clean room. This is a clumsy procedure which does not ensure cleanliness. Another method is to place the wafers within a small vacuum chamber for transport. The vacuum may exacerbate the problem since any residual gas, carbon containing contaminants, or any leakage, even in an ultra high vacuum, can easily adsorb on the unprotected wafer surface. The leaks may be real, where the vacuum draws gases in from outside the vacuum chamber, or virtual, where contaminants outgas off material within the vacuum chamber. This is most serious prior to a deposition process, where less than a monolayer of adsorbate can grossly degrade the interfacial state, thereby impairing the performance of the interface and ultimately the semiconductor device. Furthermore, the vacuum chamber is a heavy system, and requires a large pump and power supply. This limits the portability of the vacuum chamber transport system. Accordingly, there is a need to provide a lightweight portable system for transporting materials that will eliminate particulate and chemical contamination.

SUMMARY OF THE INVENTION

In accordance with the present invention, there is provided a portable purge system for transporting materials, such as semiconductor wafers. The purge system comprises a carrier having at least one compartment for receiving and enclosing the materials. Flooding means is provided for flooding the carrier with an inert gas, typically nitrogen, so as to adsorb the inert gas on the surface of the materials, dilute contaminants, and purge the contaminants from the carrier. The materials typically include semiconductor wafers used in the manufacture of integrated circuits (ICs). The carrier and the flooding means are mounted in a transport case, so that the transport case will transport the wafers. A humidifier is connected to the flooding means so that the materials will adsorb water and thereby further resist adsorption of hydrocarbon contaminants.

The flooding means typically comprises a source of nitrogen gas, such as a cylinder containing the nitrogen gas under pressure, and a pressure regulator. A shutoff valve is mounted on the cylinder, and a supply tube connects the shutoff valve to the carrier. A pressure gauge connected to the supply tube senses the gas pressure within the cylinder. A flow gauge is connected to the supply tube for sensing the rate of gas flow to the carrier. To regulate the gas flow, a flow regulating valve is connected to the supply tube.

BRIEF DESCRIPTION OF THE DRAWING

A more complete understanding of the present invention may be obtained from consideration of the following description in conjunction with the drawings, in which.

DESCRIPTION OF THE PREFERRED EMBODIMENTS

Figure 1:
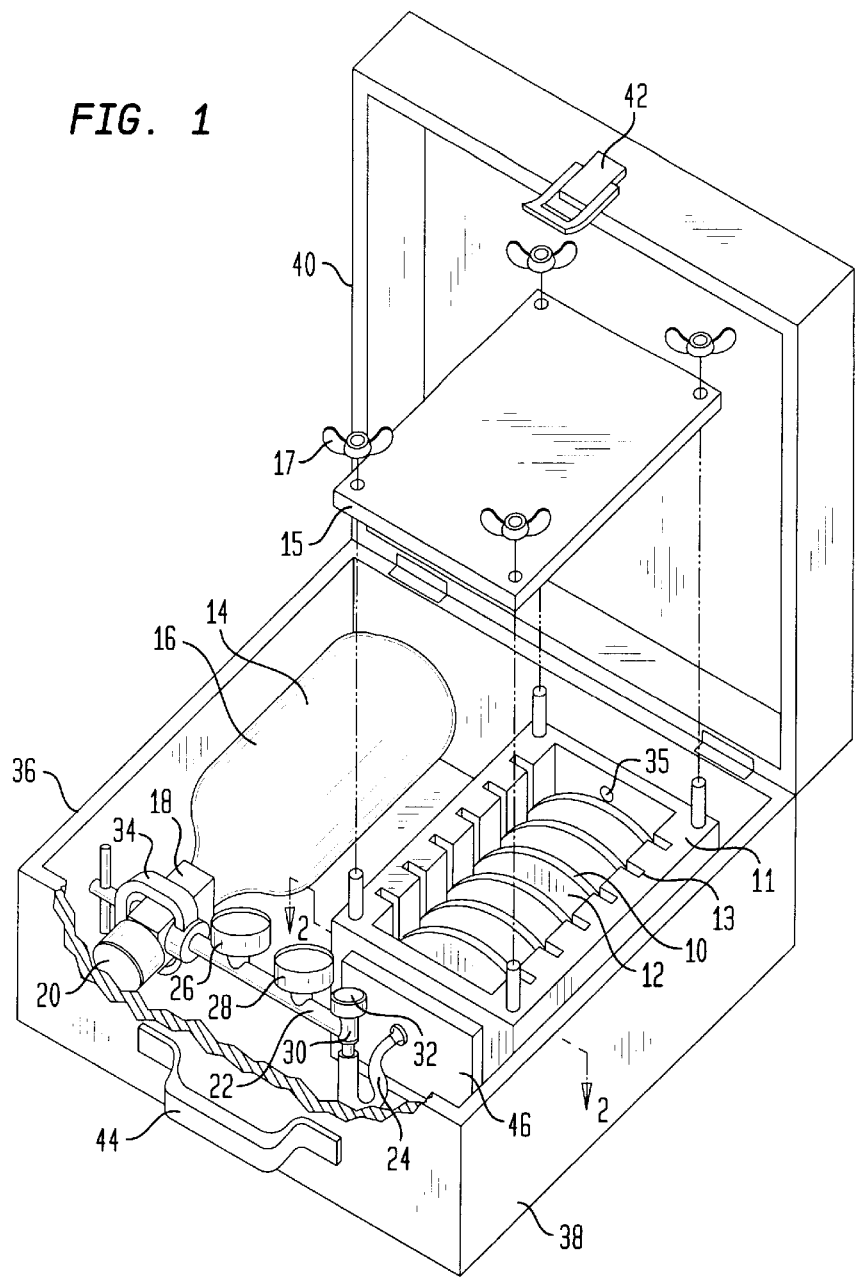
FIG. 1 is a perspective view of an exemplary portable purge system for transporting materials constructed in accordance with the invention.

Referring now to the drawings, a perspective view of a portable purge system for transporting materials is shown in FIG. 1. The purge system comprises a carrier 11 having a plurality of compartments 13 or slots for releasably receiving and enclosing the materials therein. The materials 10 include silicon and other semiconductor wafers 10. The carrier 11 shown is an enclosure with a cover 15 held on with fasteners 17.

Means is provided for flooding the carrier 11 with an inert gas, preferably nitrogen gas, so as to adsorb the nitrogen on the surface 12 of the materials 10, dilute contaminants, and purge the contaminants from the carrier 11. The flooding means typically comprises a source 14 of nitrogen gas including a cylinder 16 containing the nitrogen gas under pressure. A shutoff valve 18 actuated by a hand shutoff control 20 is mounted on the cylinder 16. A supply tube 22 connects the shutoff valve 18 to the carrier 11. The supply tube 22 may include a flexible portion 24. Pressure sensing means, namely a pressure gauge 26, is connected to the supply tube 22 for sensing the gas pressure within the cylinder 16. Flow sensing means, typically a flow gauge 28, is connected to the supply tube 22 for sensing the rate of gas flow to the carrier 11. Flow regulating means, specifically a flow regulating valve 30 with a hand-operated flow control 32, is connected to the supply tube 22 for regulating the rate of gas flow to the carrier 11 to a predetermined value. A yoke type clamp 34 is provided for connecting to a shutoff valve 18. An exit hole 35 allows contaminants and excess nitrogen to escape the carrier, and to maintain proper flow.

The carrier 11 is made from Teflon® or some other suitable material for holding and transporting semiconductor wafers. Teflon® is an inert material and does not contaminate semiconductor wafers. It is also durable and readily withstands solvents typically used to clean wafers and to maintain a clean environment for semiconductor wafers. Advantageously, the carrier 11 may be cleaned of organic material and particles prior to loading it with wafers. Although, for the described embodiment, the carrier 11 is made from Teflon®, it would be apparent to one of ordinary skill in the art to substitute other materials exhibiting the just-described characteristics.

A transport case 36 is provided in which the carrier 11 and the flooding means are mounted, so that the transport case 36 will transport the wafers 10. The transport case 36 further comprises a body portion 38, in which the carrier 11 and the nitrogen source 14 are mounted. A cover portion 40 is pivotally mounted on the body portion 38 so that the cover portion 40 will be pivoted from an open position shown in FIG. 1, wherein the wafers 10 will be loaded into and unloaded from the carrier 11, to a closed position (not shown) wherein the wafers 10 will be transported. A closure latch 42 secures the cover portion 40 in the closed position. A handle 44 is provided with which to manually carry the transport case 36.

Figure 2:
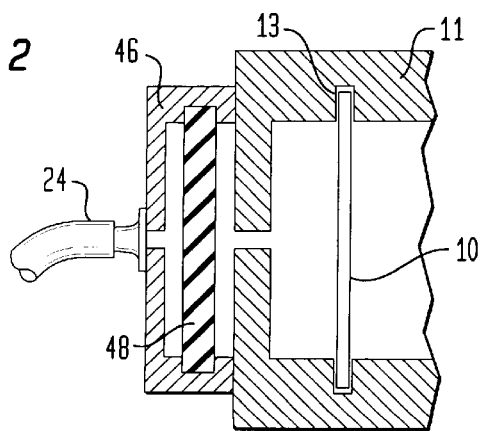
FIG. 2 is a partial cross-sectional plan view of the humidifier and part of the carrier of the purge system of FIG. 1, taken along lines 2—2 of FIG. 1.
Figure 3:
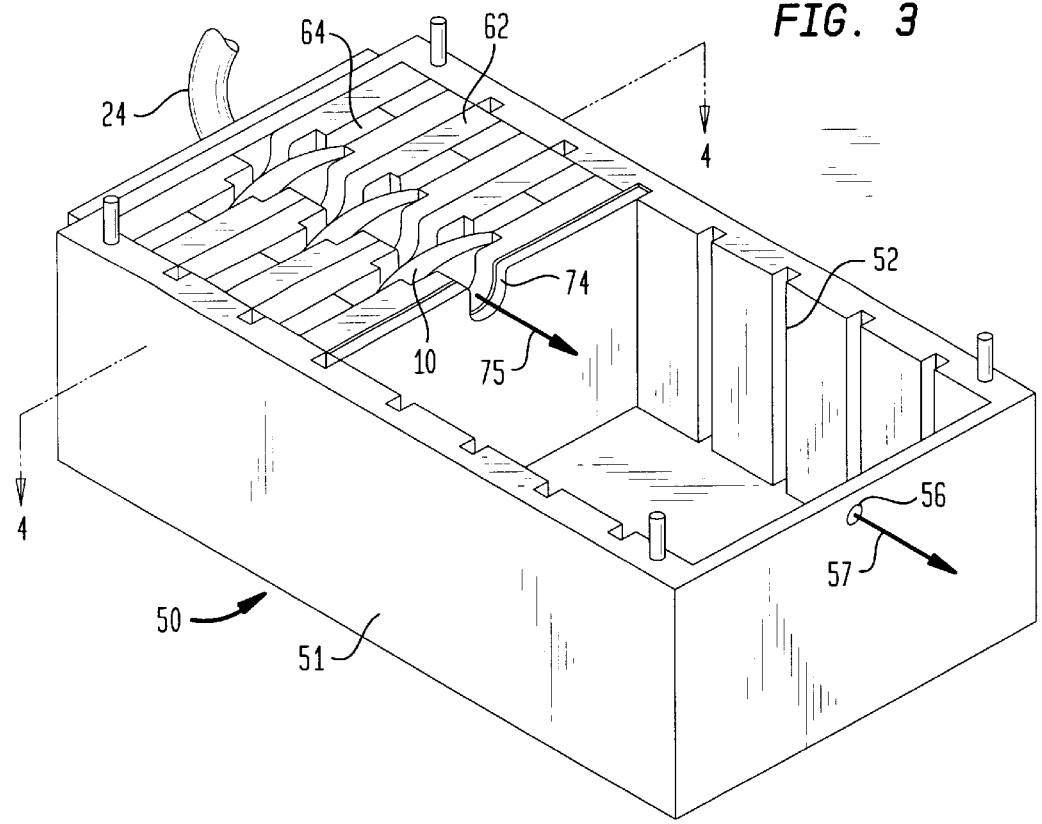
FIG. 3 is a perspective view of another embodiment of the carrier of the purge system of FIG. 1.

Referring now to FIG. 2 as well as FIG. 1, a humidifier 46 is interposed between the purge input to carrier 11 and the output of supply tube 22 (at flexible portion 24) from the source 14 of nitrogen gas so as to introduce water vapor to the gas entering the carrier 11. When water is introduced, each wafer surface 12 will adsorb water and thereby resist adsorption of hydrocarbon contaminants. The humidifier 46 includes a filter 48 saturated with water, which also traps particulates as the nitrogen gas passes through it.

The cover portion 40 is opened, the humidifier filter 48 is saturated with purified water, the carrier cover 15 is removed, the carrier 11 is removed and cleaned, and the wafers 10 are placed into the compartments 13 in the carrier 11. The carrier cover 15, which is also made from Teflon®, is cleaned and installed, and the inert gas shutoff valve 18 is turned on. The pressure in the cylinder 16, shown by the pressure gauge 26, indicates the quantity of gas remaining. The flow regulating valve 30 is adjusted to the proper flow rate, as shown by the flow gauge 28. The cover portion 40 is closed and secured by the latch 42. The transport case 36 is carried to the next station, the cover portion 40 is opened, the shutoff valve 18 is closed, the carrier cover 15 is opened, and the wafers 10 are removed.

Figure 4:
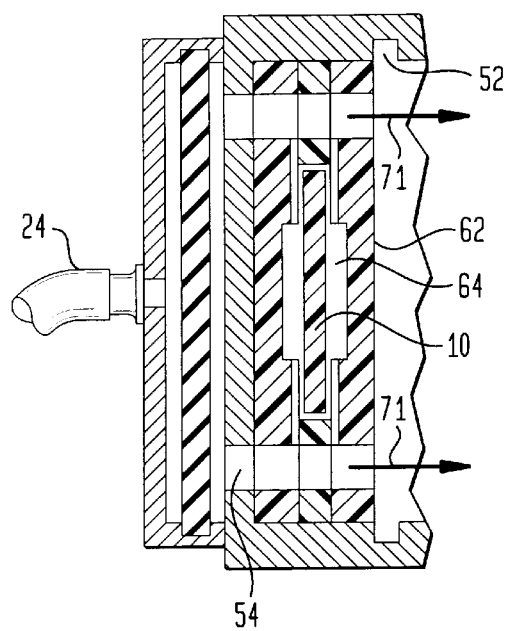
FIG. 4 is a partial cross-sectional plan view of the humidifier and part of the carrier of FIG. 1, taken along lines 4—4 of FIG. 3.

Referring now to FIGS. 3 through 9, as well as FIGS. 1 and 2, there is shown another exemplary embodiment of a carrier for use with the transport case of FIG. 1. The carrier 50 of FIG. 3 comprises a carrier enclosure 51, with a removable cover 15. The carrier enclosure 51 has an inlet port 54 (as shown in FIG. 4), preferably two inlet ports 54, to admit the inert gas, typically nitrogen gas, into the enclosure 51, along with an outlet port 56 to release the nitrogen gas from the enclosure 51, as shown by arrow 57 in FIG. 3.

A plurality of carrier sleeves 62, are disposed closely adjacent to one another. Each carrier sleeve 62 has a compartment 64 for releasably receiving and enclosing a wafer 10 therein. Each carrier sleeve 62 further comprises a first face 66, and a second face 68 opposite and generally parallel to the first face 66.

A sleeve port 70 (shown FIGS. 6–8) is provided, which communicates with the inlet port 54 when the carrier sleeve 62 is enclosed within the carrier enclosure 51. Accordingly, the sleeve port 70 will admit the nitrogen gas into the sleeve 62. The sleeve port 70 will also convey the nitrogen gas through each sleeve 62 to the adjacent sleeve 62, as shown by arrow 71 in FIG. 4.

Figure 7:
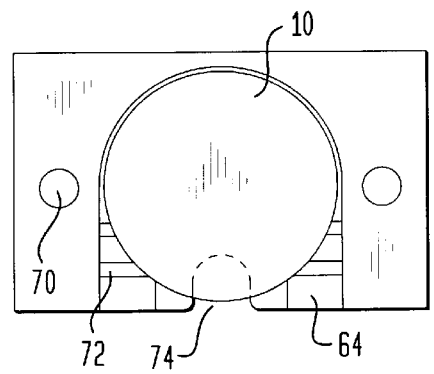
FIG. 7 is a top cross-sectional view of the carrier sleeves of FIG. 5, taken along lines 7—7 of FIG. 5.
Figure 8:
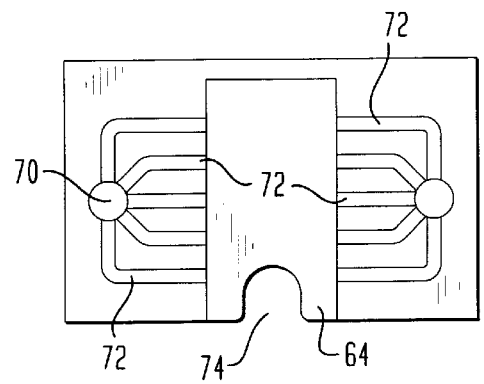
FIG. 8 is a top cross-sectional view of the carrier sleeves of FIG. 5, taken along lines 8—8 of FIG. 5.
Figure 6:
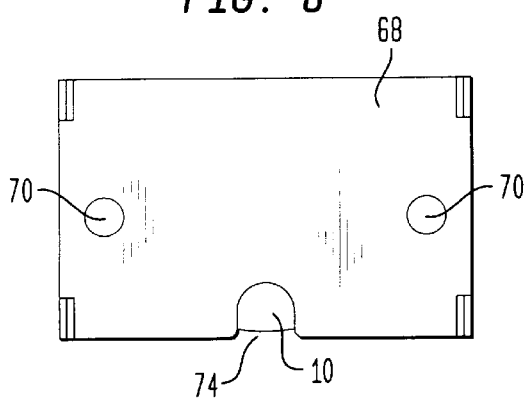
FIG. 6 is a top view of the carrier sleeves of FIG. 5.
Figure 9:
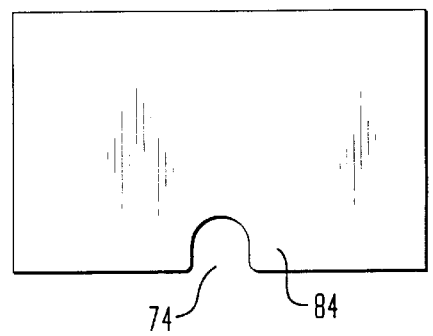
FIG. 9 is a top view of a retainer plate of the carrier of FIG. 3.

A plurality of channels 72 are formed within the carrier sleeve compartment 64 (FIG. 8). The channels 72 are juxtaposed with the wafer surface 12 when the wafer 10 is in the compartment 64 (FIG. 7). The channels 72 communicate with the sleeve port 70, wherein the channels 72 will convey the nitrogen gas across the wafer surface 12.

A sleeve aperture 74 is provided in one edge of the sleeve 62, wherein the wafer 10 will be grasped, manually or with an implement, to facilitate removal of the wafer 10 from the sleeve 62. The aperture 74 also allows the gas to flow out of the compartment 64, as shown by arrow 75 in FIG. 3.

Figure 5:
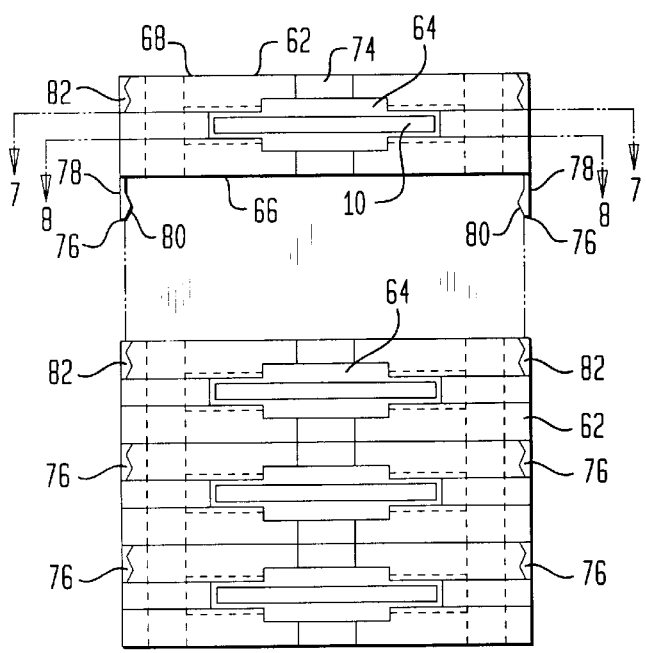
FIG. 5 is a front elevation view of the carrier sleeves of FIG. 3.

The carrier 50 also comprises securing means, specifically at least one connecting element 76 projecting from each carrier sleeve 62 (FIG. 5). The connecting element 76 will typically be a finger 78 having a barb 80 which engages a slot 82 in the adjacent sleeve 62. In this manner, the connecting elements 76 will releasably connect adjacent sleeves 62 together with the faces 66 and 68 juxtaposed and the sleeve ports 70 communicating with one another. The sleeve faces 66 and 68 may also releasably connect using connecting elements 78 and 82 so that the materials may be placed in, or removed from, the sleeves 62 by separating the faces 66 and 68. The securing means also includes a retainer plate 84 slidingly engaging a plurality of slots 52 along opposite inner sides of the carrier enclosure 51. The retainer plate 84 secures the sleeves 62 against movement within the carrier enclosure 51. The retainer plate 84 also serves to juxtapose the sleeve ports 70 with the inlet port 54, and preclude the gas from exiting the sleeve ports 70. This will induce the gas to flow through the channels 72 and out the sleeve apertures 74.

The carrier 50 may also be used without the enclosure 51. Each sleeve 62, which may be cylindrical in shape, integrally connects with each adjacent sleeve by engaging the connecting element 76 with slot 82. The number of stacked cylindrical sleeves 62 are chosen to accommodate the number of wafers 10 to be transported. The resulting carrier 50 is a cylinder whereby wafers are removed by removing a sleeve 62 from the stack of sleeves comprising the carrier 50. A cylindrical carrier advantageously permits cleaning the carrier 50 using known cleaning devices. When the carrier 50 is used without the carrier enclosure 51, sleeve port 70 acts as an inlet port for nitrogen gas. The humidifier 46 is mounted directly to the topmost sleeve 62. To further minimize the risk of contamination, the wafers 10 should be placed within the sleeves 62 and the carrier 50 should be assembled prior to placing the carrier into the transport case 36. Any number of known methods may be used to secured the carrier 50 within the transport case 36.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which will come within the scope of the appended claims is reserved.

What is claimed:

1. A purge system for transporting objects, the system comprising:
    a carrier having an inlet port to admit inert gas therefrom, the carrier comprising a plurality of adjacent carrier sleeves having a compartment for enclosing an object therein, the object having a surface. the carrier sleeves having a sleeve port communicating with the inlet port wherein the sleeve port will admit the inert gas into the sleeve and convey the inert gas through the sleeve to the adjacent sleeve; and
    flooding means for flooding the carrier with the inert gas, wherein the inert gas adsorbs on the surface and purges contaminants from the carrier.
2. The purge system of claim 1, wherein:
    the objects include semiconductor wafers; and
    the inert gas includes nitrogen gas.
3. The purge system of claim 1 wherein the carrier is made from an inert material.
4. The purge system of claim 3, wherein the material is plastic.
5. The purge system of claim 1, further comprising:
    a transport case for mounting said carrier and said flooding means.
6. The purge system of claim 1, wherein the flooding means further include:
    a cylinder containing said inert gas;
    a shutoff valve mounted on the cylinder, said shutoff valve operable to release said inert gas from said cylinder;
    a supply tube connecting the shutoff valve to the carrier; and
    flow regulating means for regulating the rate of inert gas flow to the carrier.
7. The purge system of claim 6, further comprising flow sensing means for sensing a rate of gas flow to said carrier.
8. The purge system of claim 7, further comprising pressure sensing means for sensing a gas pressure within the cylinder.
9. The purge system of claim 1, further comprising:
    a humidifier connected to the flooding means, wherein water vapor is introduced to the inert gas entering the carrier.
10. The purge system of claim 9 wherein said humidifier includes a filter.
11. The purge system of claim 1, wherein the carrier further comprises:
    at least one carrier sleeve having a compartment for releasably receiving and enclosing the materials therein; and
    a carrier enclosure for releasably receiving said at least one carrier sleeve.
12. The purge system of claim 8, wherein:
    the pressure sensing means includes a pressure gauge connected to the supply tube;
    the flow sensing means includes a flow gauge connected to the supply tube;
    the flow regulating means includes a flow regulating valve connected to the supply tube; and
    the inert gas includes nitrogen gas.
13. The purge system of claim 5, wherein the flooding means floods the carrier from an inert gas source, and wherein the transport case further comprises:
    a body portion in which the carrier and the inert gas source are mounted; and,
    a cover portion pivotally mounted on the body portion.
14. The purge system of claim 1, wherein the carrier sleeves have
    a plurality of channels within the carrier sleeve compartment, the channels communicating with the sleeve port, wherein the channels will convey the inert gas across the object surface.
15. The purge system of claim 5 wherein the carrier sleeve further includes a sleeve aperture in one edge of the sleeve, wherein the wafer will be grasped to facilitate removal of the wafer from the sleeve.
16. The purge system of claim 15 further comprising a carrier enclosure for enclosing the carrier, the carrier enclosure having an inlet port to admit the inert gas and an outlet port to release the inert gas, the enclosure including a plurality of slots along opposite inner sides thereof, and a securing means comprising:
    at least one connecting element projecting from each carrier sleeve, the connecting element engaging the adjacent sleeve, wherein the adjacent sleeves releasably connect together with the faces juxtaposed and the sleeve ports communicating with one another; and
    a retainer plate slidingly engaging the carrier slots, the retainer plate operable to secure the sleeves against movement within the carrier enclosure, juxtapose the sleeve ports with the inlet port, and preclude the gas fom exiting the sleeve ports, thereby inducing the gas to flow through the channels and out the sleeve apertures.
17. The purge system of claim 5, wherein the carrier sleeves are cylindrical.
18. The purge system of claim 17, said carrier sleeves comprising:
    a first face;
    a second face; and,
    a means for connecting said first face with said second face, said means including:
        at least one connecting element projecting from each carrier sleeve face, the connecting element engaging the adjacent face, wherein the adjacent faces releasably connect together with the faces juxtaposed.
19. A purge method for transporting objects, each having a surface, the purge method comprising the steps of:
    enclosing the objects within compartments corresponding to a plurality of adjacent carrier sleeves of a carrier, the carrier having an inlet port to admit inert gas therefrom, the carrier sleeves having a sleeve port communicating with the inlet port wherein the sleeve port will admit the inert gas into the sleeve and convey the inert gas through the sleeve to the adjacent sleeve; and
    flooding the carrier with the inert gas, wherein the inert gas adsorbs on the surface.

20. The purge method of claim 19, wherein the flooding step includes the steps of:

containing the inert gas under pressure within a cylinder; and regulating a rate of gas flow to the carrier.

21. The purge method of claim 19, further comprising:

introducing water vapor to the gas entering the carrier, wherein water is adsorbed on the surfaces of the objects.

22. The purge method of claim 19 wherein the carrier is made from an inert material.

23. The purge method of claim 22 wherein the inert material is plastic.

24. The purge method of claim 19, wherein the carrier sleeves have a plurality of channels within the carrier sleeve compartment, the channels communicating with the sleeve port, wherein the channels will convey the inert gas across the object surface.

* * * * *